United States Patent
Benosman et al.

(10) Patent No.: US 11,948,071 B2
(45) Date of Patent: Apr. 2, 2024

(54) DEEP LEARNING-BASED ONLINE ADAPTATION OF DIGITAL PRE-DISTORTION AND POWER AMPLIFIER SYSTEMS

(71) Applicant: Mitsubishi Electric Research Laboratories, Inc., Cambridge, MA (US)

(72) Inventors: Mouhacine Benosman, Boston, MA (US); Rui Ma, Carlisle, MA (US); Chouaib Kantana, Paris (FR); Richard C Waters, Lincoln, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 754 days.

(21) Appl. No.: 17/145,444

(22) Filed: Jan. 11, 2021

(65) Prior Publication Data
US 2022/0198253 A1    Jun. 23, 2022

Related U.S. Application Data

(60) Provisional application No. 63/129,824, filed on Dec. 23, 2020.

(51) Int. Cl.
*G06N 3/065*    (2023.01)
*G06F 18/214*    (2023.01)
(Continued)

(52) U.S. Cl.
CPC ........... *G06N 3/065* (2023.01); *G06F 18/214* (2023.01); *G06F 18/24155* (2023.01);
(Continued)

(58) Field of Classification Search
CPC ........ G06N 3/065; G06N 3/045; G06N 3/044; G06N 3/08; G06N 5/01; G06N 7/01;
(Continued)

(56) References Cited

U.S. PATENT DOCUMENTS 11,303,251 B2 * 4/2022 Wu .................. H04B 1/0475
2013/0243122 A1 * 9/2013 Bai .................. H03F 1/3258
(Continued)

FOREIGN PATENT DOCUMENTS

WO    WO-2019070573 A1 *  4/2019  ........... H03F 1/3258

*Primary Examiner* — Lana N Le
(74) *Attorney, Agent, or Firm* — Gene Vinokur

(57) ABSTRACT

An auto-tuning controller for improving a performance of a power amplifier system is provided. The controller includes an interface including input terminals and output terminals, the interface being configured to acquire input signal conditions of power amplifiers (PAs), a training circuit including a processor and a memory running and storing a Digital Doherty amplifier (DDA) controller (module), a DPD controller (module) and a DDA-DPD neural network (NN). The training circuit is configured to perform sampling the input signal conditions, and selecting a DPD model from a set of polynomial models for the DPD controller and a set of DDA optimization variables for the DDA controller, using optimized DPD model and DDA coefficients, wherein the optimized DPD model and DDA coefficients are provided by performing an offline optimization for the DPD model and DDA coefficients based on a predetermined optimization method, collecting the optimized DPD coefficients and optimized DDA optimization variables, generating online-DDA optimal coefficients and DPD optimal coefficients using a trained DDA-DPD NN, and updating the generated optimal DDA and DPD coefficients via the output terminals of the interface.

20 Claims, 14 Drawing Sheets

(51) Int. Cl.
 *G06F 18/2415* (2023.01)
 *G06N 3/08* (2023.01)
 *H03F 3/20* (2006.01)
 *H03F 3/26* (2006.01)
(52) U.S. Cl.
 CPC ............... *G06N 3/08* (2013.01); *H03F 3/20* (2013.01); *H03F 3/26* (2013.01)
(58) Field of Classification Search
 CPC .... G06F 18/214; G06F 18/24155; H03F 3/20; H03F 3/26; H03F 1/3247; H03F 2200/451; H03F 1/0288; H03F 1/3258; H03F 3/195; H03F 3/245; H04B 17/13; H04B 2001/0408; H04B 2001/0425; H04B 1/62; H04B 1/0475; H04B 1/04; H04B 2001/0416; H04L 25/49; H04L 27/367; H04L 27/368; H04L 41/16; H04L 25/0254; H04L 25/03165
 See application file for complete search history.

(56) References Cited

U.S. PATENT DOCUMENTS

| | | | |
|---|---|---|---|
| 2019/0131933 A1* | 5/2019 | Ma | H03F 3/26 |
| 2021/0203282 A1* | 7/2021 | Van Liere | H04B 1/0475 |
| 2022/0368571 A1* | 11/2022 | Yu | H04L 27/367 |

\* cited by examiner

DEEP LEARNING-BASED ONLINE ADAPTATION OF DIGITAL PRE-DISTORTION AND POWER AMPLIFIER SYSTEMS

FIELD OF THE INVENTION

The present invention is related generally to a power amplifier system, and more particularly to a digital Doherty power amplifier system and a learning-based auto-tuning optimization method of a Digital Pre-Distortion (DPD) system and power amplifier system for enhancing performance of radio frequency power amplifier.

BACKGROUND

The rapid growing of wireless communication data volume and rate significantly raise the power consumption in wireless transmitters, in which the power amplifier (PA) is the key component for energy consumption. Several advanced techniques including Envelope Tracking (ET), Doherty Power Amplifier (DPA), Envelop Elimination and Restoration (EER) have been proposed to improve the Power Added Efficiency (PAE) of PA. Among these techniques, DPA is very promising thanks to its simple structure enabling high average efficiency, which is on the basis of active load modulation.

Although the DPA shows numerous advantages for efficiency enhancement, traditional analog DPA still suffers from imperfection which results in a degraded performance in terms of energy efficiency and operational bandwidth. Traditional DPA design is based on single input configuration that contains an analog power splitter (maybe tunable), fixed phase alignment, carrier PA running on class-AB and peak PA running on class-C mode, as well as an output power combiner. To improve DPA efficiency, several methods are studied, including gate bias adaption, asymmetrical DPA, multi-way DPA, tunable phase alignment, and adaptive power splitting ratio.

In order to obtain the optimal Digital Pre-Distortion (DPD) and PA performances, the designer needs to manually tune the circuit operation parameters and the tuning process is only valid for fixed operating conditions such as input power, frequency, and signal standard. While in the practical scenarios, the optimal control parameters do vary with changing inputs and circuit states. The compensation circuit part is also complicated and challenging to optimize, making DPA design cumbersome. These are very limitations from pure analog based design.

There is a need for a more flexible architecture such as digital DPAs (DDPAs) to adaptively find the optimal control parameters for various circuit states and input signals of various bandwidths, modulation formats, power levels and modulation formats. Furthermore, in this invention we propose to not only auto-tune the control parameters of the PA, but also auto-tune the learning cost function of the PA, as a function of the DPD performance, such that both systems improve their performances in synchrony.

SUMMARY OF THE INVENTION

Some embodiments are based on recognition that a Digital Power Amplifier (DPA) is programmable, so that it facilitates circuit tuning procedure (auto-tuning) for designer and can take into account on circuit imbalance such as phase delay for multiple paths and environment changes including temperatures and aging. Therefore, the DPA is not only flexible, but also able to provide enhanced performance compared with analog DPAs.

Further, some embodiments of the present invention provide an auto-tuning controller for improving a performance of a power amplifier system. The auto-tuning controller may include an interface including input terminals and output terminals, the interface being configured to acquire input signal conditions of power amplifiers (PAs); a training circuit including a processor and a memory running and storing a Digital Doherty amplifier (DDA) controller (module), a DPD controller (module) and a DDA-DPD neural network (NN). In this case the training circuit is configured to perform sampling the input signal conditions, and selecting a DPD model from a set of polynomial models for the DPD controller and a set of DDA optimization variables for the DDA controller; using optimized DPD model and DDA coefficients, wherein the optimized DPD model and DDA coefficients are provided by performing an offline optimization for the DPD model and DDA coefficients based on a predetermined optimization method; collecting the optimized DPD coefficients and optimized DDA optimization variables; generating online-DDA optimal coefficients and DPD optimal coefficients using a trained DDA-DPD NN; and updating the generated optimal DDA and DPD coefficients via the output terminals of the interface.

According to embodiments of the present invention, a DPA system, a Digital Doherty Power Amplifier (DDPA) system, a Digital Pre-Distortion (DPD) and a learning-based auto-tuning method (optimization method) are provided, which particularly improve the efficiency and gain, while DPD is operating together with PA system by adaptive control to meet linearity requirement at the same time. The DDPA system and the optimization method can be used for broadband mobile communications including 3G, 4G LTE and 5G base station radio front end of the transmitters.

Yet further, according to some embodiments of the present invention, a Digital Doherty Power-Amplifier (DDPA) system is provided. The DDPA may include an auto-tuning controller for improving a performance of a power amplifier system. In this case, the auto-tuning controller may include an interface including input terminals and output terminals, the interface being configured to acquire input signal conditions of power amplifiers (PAs); a training circuit including a processor and a memory running and storing a Digital Doherty amplifier (DDA) controller (module), a DPD controller (module) and a DDA-DPD neural network (NN). In this case the training circuit is configured to perform sampling the input signal conditions, and selecting a DPD model from a set of polynomial models for the DPD controller and a set of DDA optimization variables for the DDA controller; using optimized DPD model and DDA coefficients, wherein the optimized DPD model and DDA coefficients are provided by performing an offline optimization for the DPD model and DDA coefficients based on a predetermined optimization method; collecting the optimized DPD coefficients and optimized DDA optimization variables; generating online-DDA optimal coefficients and DPD optimal coefficients using a trained DDA-DPD NN; updating the generated optimal DDA and DPD coefficients via the output terminals of the interface; and a Doherty power amplifier (DPA) circuit having control inputs and an output for generating output signals.

Some embodiments of the present invention provide a DPD and a Digital Doherty amplifier (DDA) system that fully adaptively find the optimal control parameter set, in-spite of device parameters, environment variances without complicated engineering tunings, where optimal control aims, for example, at high efficiency with reasonable gain in wideband power transmitter.

One embodiment of the invention is model-free algorithm that does not have assumptions or prior knowledge on DPA devices, where the algorithm is based on black-box optimization to search the optimal configuration. The optimal configuration consists in the optimal DPD model's coefficients, as well as, the optimal PA coefficients. This optimal configuration is obtained offline for different operating conditions, such as input power condition, frequency bandwidth and signal modulations, etc. When sufficient optimal data is collected offline, we propose to train a deep neural network (DNN) model, which maps operating conditions to optimal DPD and/or DPA configurations.

Some of embodiments not only optimize on DPA efficiency, but also enhance the gain and linearity performance in a flexible way, whereas the linearity property term in the learning cost is proportional to the DPD linearization performance. For example, in some embodiments, the system can balance the gain and efficiency trade-off in different frequency bands, or maximize the efficiency under certain constraints. One example is to optimize efficiency while requiring gain greater than configured threshold. In the case of modulated signal, we optimize Efficiency, Gain along with Adjacent Channel Power Ratio (ACPR) under the same DDPA scenario. ACPR is an important linearity indicator for modulated signal to have limited power emitted from main channels to adjacent channels.

According to embodiments of the present invention, a Digital Power Amplifier (DPA) system includes a power amplifier (PA) circuit having control inputs and an output for generating output signals; and an adaptive control circuit comprised of an input interface, an output interface, a memory storing an adaptive control algorithm and a processor performing instructions based on the adaptive control algorithm in connection with the memory, wherein the input interface receives input-state signals and output signals of the PA circuit, wherein the adaptive control algorithm determines, in response to the input-state signals and the output signals, control parameters of control signals transmitted to the control inputs from the output interface for controlling operations of the PA circuit.

BRIEF DESCRIPTION OF THE DRAWINGS

The accompanying drawings, which are included to provide a further understanding of the invention, illustrate embodiments of the invention and together with the description serve to explain the principle of the invention.

FIG. 4B-1 is a block diagram showing a realization of the DNN shared control module for DPD and DDA, according to embodiments of the present invention;

FIG. 4B-2 is a block diagram showing the realization of DPD models and DDA optimization coefficients, according to embodiments of the present invention;

FIG. 4C-1 is a block diagram showing a realization of the DNNs shared control module for DPD and DDA, according to embodiments of the present invention;

DETAILED DESCRIPTION OF THE PREFERRED EMBODIMENTS

Figure 1:
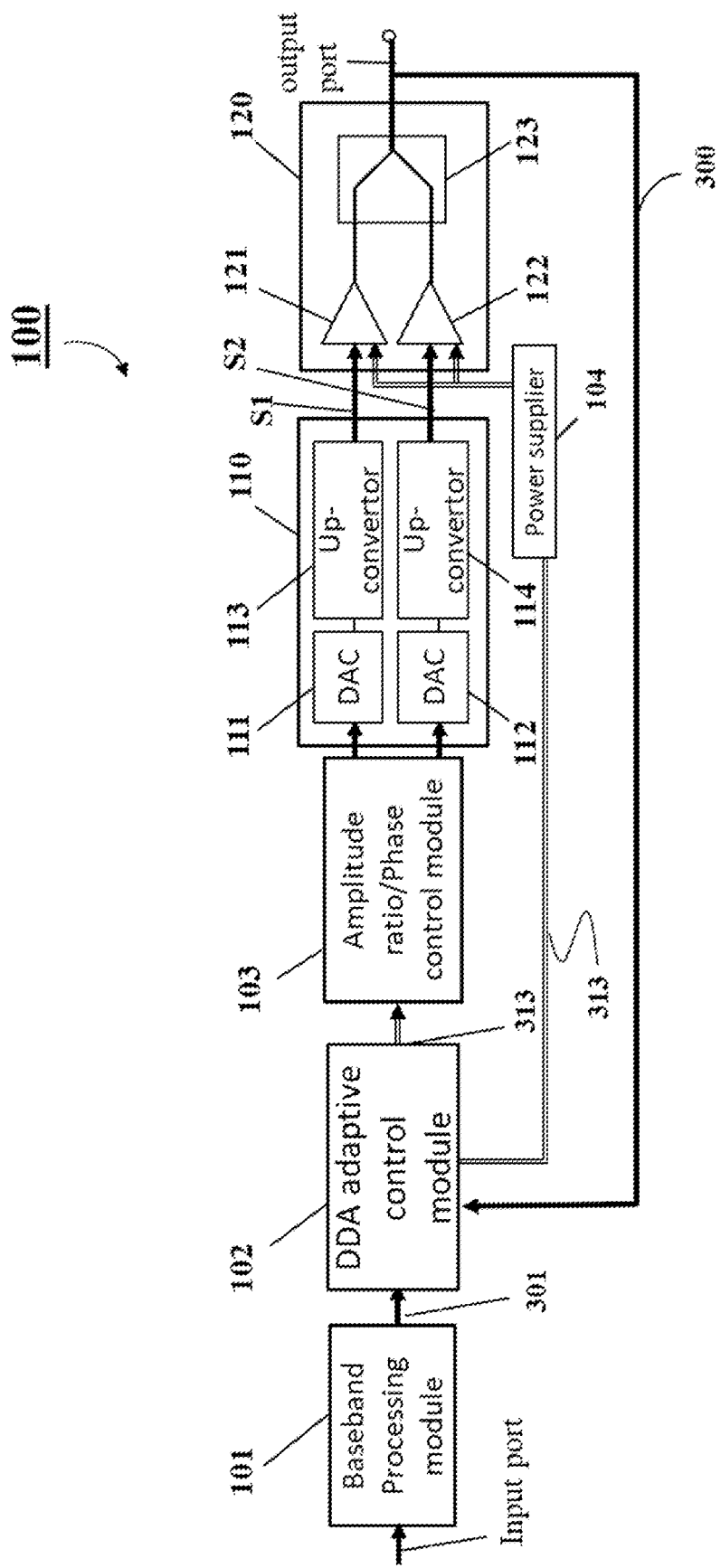
FIG. 1 is a block diagram illustrating a digital power amplifier (DPA) of a prior art.

Various embodiments of the present invention are described hereafter with reference to the figures. It would be noted that the figures are not drawn to scale and elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

FIG. 1 is a block diagram of a digital power amplifier (DPA) module 100, according to some embodiments of the present invention. The DPA module 100 may be a digital power amplifier (DPA) module that is configured by multi-input power amplifiers 120 such as Doherty power amplifiers, out-phasing power amplifiers, balanced power amplifiers and push-pull power amplifiers etc. As an example, Doherty power amplifiers are used in the digital power amplifier (DPA) module 100 to explain the functions of the DPA module. The DPA module 100 may be referred to as a DDPA (Digital Doherty Power Amplifier) module 100. However, it should be noted that the out-phasing power amplifier circuit, the balanced power amplifier circuit or the push-pull power amplifier circuit can also be used depending upon the circuit design variations.

The DDPA module 100 may include a baseband processing module 101, a digital Doherty amplifier (DDA) adaptive control module 102, an amplitude ratio-phase control module (Amp-phase module) 103, a signal convertor 110, a dual-input DPA module (DPA module, but not limited to dual inputs) 120 and a power supplier 104 for providing bias conditions (voltage and/or current) to the DPA unit 120 according to optimal control parameters (or control parameters) 313 generated by the DDA adaptive control module 102. The DPA module 120 includes a main PA (carrier PA) 121, a peak PA 122 and an output combiner 123. The signal convertor 110 includes digital-to-analogue convertors (DACs) 111 and 112 and up-convertors 113 and 114.

The dual-input DPA 120 includes a carrier power amplifier (PA) 121 for controlling carrier signals and a peak power amplifier (PA) 122 for controlling peak signals, and the output combiner 123 for combining the signals from the carrier and peak PAs 121 and 122. It is obvious that the configuration of digital Doherty can be extended to multi-way Doherty, where the more than two PA are involved with similar topologies described in 100.

The DDA adaptive control module 102 may be referred to as digital adaptive (DA) control module 102 when the power amplifiers other than Doherty amplifiers are used in the module 100.

The input signals 301 are sent to the DA adaptive control module 102. The DA adaptive control module 102 performs the data-driven optimization and generates the optimal control parameters 313 with respect to the phase difference θ between the PAs 121 and 122 and the input-power ratio α for the PAs 121 and 122, using the input signals 301 and output signals 300 from the DPA module 120. In some cases, the control parameters 313 may be referred to as updated DDPA parameters. The updated DDPA parameters 313 are provided to the Amp-phase module 103. Further, the optimization discussed above may be referred to as a learning-based auto-tuning method of the power amplifier system.

In this case, the control parameters 313 include gate bias parameters of the PAs 121 (Vg1) and 122 (Vg2), phase difference θ between the PAs 121 and 122, and input-power distribution (ratio α) for the PAs 121 and 122. Further, the power supplier 104 receives the gate bias parameters from the DDA adaptive control module 102 and applies gate bias voltages to the PAs 121 and 122 according to the gate bias parameters (Vg1, Vg2). When the Amp-phase module 103 receives the phase difference between the PAs 121 and 122 and the input-power ratio for the PAs 121 and 122 from the DDA adaptive control module 102 as part of the control parameters 313, the Amp-phase module 103 generates signals S1 and S2 to be applied to the PA 121 and the PA 122, respectively. In this case, the signals S1 and S2 are formed so that the amplitude ratio of the signals S1 and S2 and the phase difference between the signals S1 and S2 satisfy values indicated by the optimal control parameters 313 computed by the DDA adaptive control module 102.

In some cases, the DDA adaptive control module 102 can include the power supplier 104, and the PAs 121 and 122 can be field-effect-transistors (FETs) fabricated using gallium nitride (GaN) based materials or other different semiconductor device technologies. Further, the PAs 121 and 122 can be bipolar transistors (BPTs). In this case, the gate biases are replaced with base current biases of the bipolar transistors. The BPTs can be formed by GaN based materials or other different semiconductor device technologies.

Output signals of the output combiner 123 (for instance, quarter-wave transmission line can be used as output combining network. Further, other format such as lumped components inductors, capacitor based can also be used to conduct the same combining function) can be transmitted from an antenna (not shown) via a predetermined band pass filter (not shown). Further, the output signals of the output combiner 123 are received (detected) by the input interface (not shown) of the DDA control module 102 to compute the control parameters 313 that control the carrier PA 121 and the peak PA 122, respectively. In some cases, the control parameters 313 may be referred to as tuning parameters.

Each of the carrier and peak PAs 121 and 122 can be controlled by the control parameters 313 indicating gate-bias, phases and input signals power. The phase-signals and input-power signals are applied to the Amp-phase module 103. The Amp-phase module 103 adjusts the amplitude ratio and phases of signals of the carrier and peak PAs 121 and 122 according to the control parameters 313 produced by the DDA adaptive control module 102.

In this case, the signal convertor 110 generates and provides the phase-signals and input-power signals to the carrier and peak PAs 121 and 122 via a drive amplifier (not shown) driving the carrier and peak PAs 121 and 122 if necessary.

The DDA adaptive control module 102 includes a processor (not shown) in connection with one or more memories (not shown) storing the adaptive control algorithm, in which the processor performs instructions according to the predetermined adaptive control algorithm. Further, the adaptive control algorithm is based on a model-free optimization called an adaptive tuning control.

The control parameters 313 are generated by the DDA adaptive control module 102 that computes the values of the control parameters 313 by the adaptive optimization control. In some cases, the control parameters 313 may be referred to as data-driven optimization parameters.

Further, the DDA adaptive control module 102 also includes an input interface (not shown) to receive the input signals 301 and the output signals 300 of the dual-input DPA module 120, and an output interface (not shown) that generates the control parameters 313 that include phase control signals, power-ratio control signals and bias-signals for controlling the dual-input DPA 120 and the carrier and peak PAs 104 and 105.

The DDA adaptive control module 102 receives baseband signals from the baseband processing module 101 and detects output signals 300 of the output combiner 106 via the input interface to produce the control parameters 313, which can be referred to as data-driven optimization parameters 313, based on the adaptive control algorithm. In this case, part of the data-driven optimization parameters 313 is provided to the Amp-phase control module 103 via the output interface for controlling phases and power ratios of the PAs 121 and 122. Further, another part of the data-driven optimization parameters 313 is converted to gate biases respectively supplied to the PAs 121 and 122 via the power supplier 104 for controlling the gate biases of the PAs 121 and 122.

In FIG. 1, the DDPA module 100 is programmable so that it facilitates circuit tuning procedure for designer and can fully take into account on circuit imbalance and imperfections for multiple paths. Therefore, the DDPA module 100 is not only flexible and low cost, but also provide better performance compared with analog DPA. The design according to an embodiment of the present invention benefits from software-designed principle so that the control ports can be adapted to reach the optimal performance through algorithms.

Making an RF power amplifier more efficient means driving it to a point near its point of saturation. In such a case, the modulated waveforms tend to be distorted (introducing nonlinearity characterized by ACPR: Adjacent channel power ratio). Thus, the design goal is to maximize the Power Added Efficiency (PAE), while maintaining high gain and good linearity (ACPR). In some cases, digital linearity can be achieved through Digital Pre-Distortion (DPD).

Figure 2:
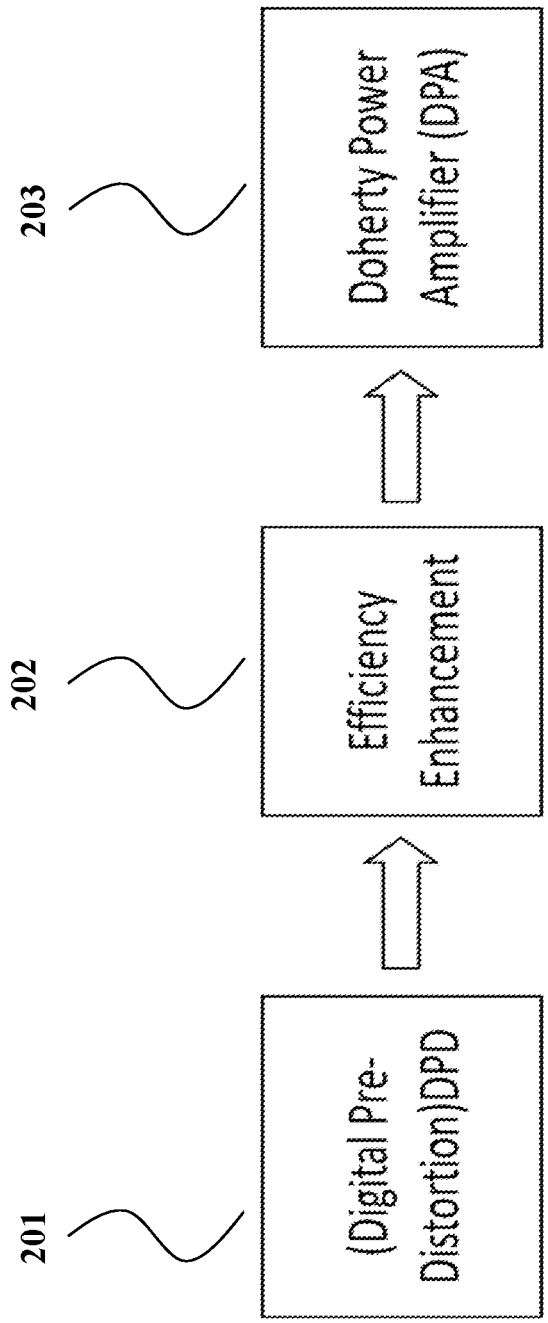
FIG. 2 is a schematic illustrating stages in improving linearity and efficiency of the power amplifier through a DPD (Digital Pre-distortion) process, according to a related art.

FIG. 2 shows stages in improving linearity and efficiency of the PAs 121 and 122 through a DPD (Digital Pre-distortion) process 201 and an efficiency enhancement process 202 respectively. In the processes, the digital pre-distortion of input signals is performed in step 201, the efficiency enhancement is performed in step 202, and the input signals obtained by the processes through the digital pre-distortion (DPD) and the efficiency enhancement are provided to the PAs 121 and 122 in step 203.

Figure 3A:
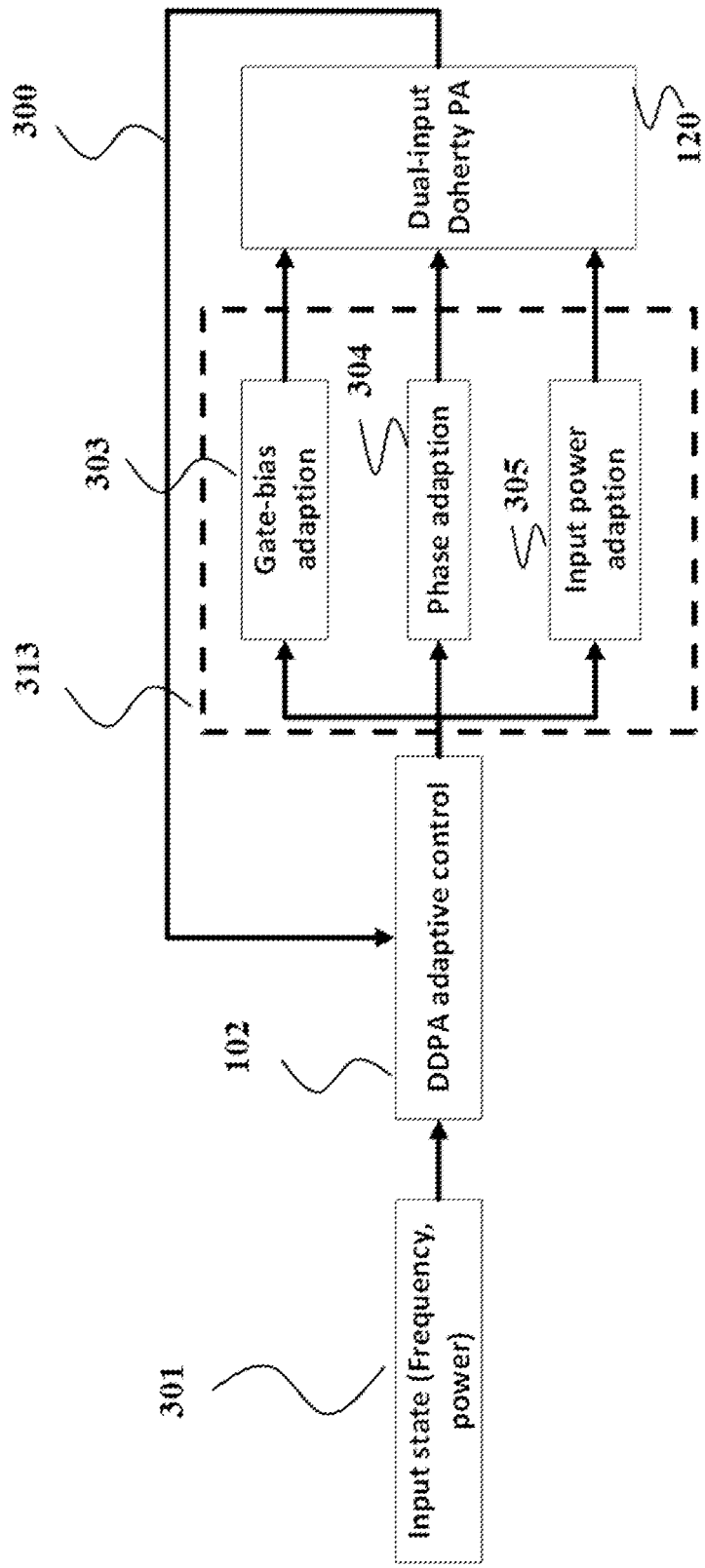
FIG. 3A is a schematic illustrating a detailed block diagram of a novel algorithm for PA auto-tuning, according to a related art.

FIG. 3A shows a detailed block diagram of our algorithm for PA auto-tuning where input signals (input state signals) 301 is used as an input state including different states indicating the Frequency and Input power level but not limited to these two states, other states such as signal modulation format can be included as well. The input state signal 301 indicating Frequency and Input signal power level is fed into the DDA adaptive control module 102 to adaptively tune the control parameters 313 of the DDPA 120 such as Gate-bias 303, phase difference 304 between main and peak amplifiers, and input power distribution 305, by using the input signal 301 and the output signal 300 of the dual input DPA module 120. Finally, tuned parameters are fed to the dual input DPA module 102.

According to circuit design variations, the DPA module 120 may include three or more than three power amplifiers (PAs). For instance, see FIG. 3B. In such a case, the DDA adaptive control module 102 provides control parameters 313 for each of the three or more than three power amplifiers.

Figure 3B:
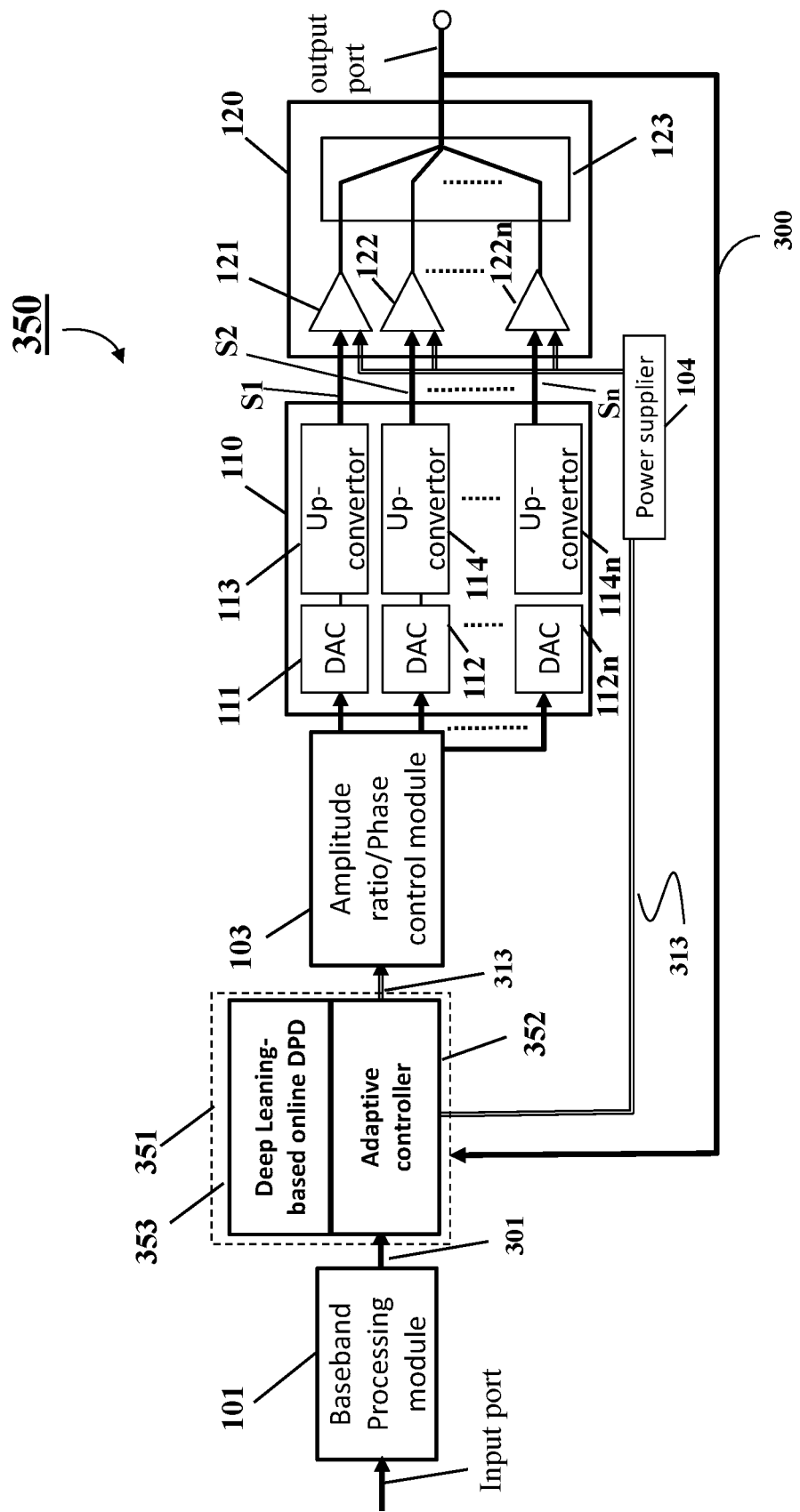
FIG. 3B is a schematic illustrating a block diagram of a digital power amplifier (DPA), according to embodiments of the present invention.

FIG. 3B is a block diagram illustrating a multi-input digital power amplifier module (for example, a Digital Doherty Power-Amplifier (DDPA) system) 350 that performs an auto-tuning process of a DPA module, according to embodiments of the present invention.

In the figure, identical part numbers in FIG. 1 are used for parts when the functions of the parts are similar to those in FIG. 1. Further, descriptions for the identical part numbers are omitted.

The multi-input digital power amplifier module 350 includes a baseband processing module 101, a DDA adaptive control module (auto-tuning controller) 351, an amplitude ratio/phase control module 103, a signal convertor 110, and a multi-input PA module 120. In this case, the signal convertor 110 includes digital-to-analogue convertors (DACs) 111, 112 and 112n, and up-convertors 113, 114 and 114.

The DDA adaptive control module 351 may be referred to as a shared control module for DPD and DDA. For instance, the configurations or functions are described below based on FIG. 4A through FIG. 5.

The DDA adaptive control module 351 includes an adaptive controller 352, a deep learning-based online DPD 353 and parts that are not shown in the figures. For instance, the auto-tuning controller 351 includes a training circuit and an interface including input terminals and output terminals. The interface is configured to acquire signals 301 from the baseband processing module 101, signal conditions 300 from the power amplifiers (PAs) 120, and transmit the optimal control parameters (optimal control parameter signals) 313.

The training circuit includes a processor and a memory for running and storing a Digital Doherty amplifier (DDA) controller (module), a DPD controller (module) and a DDA-DPD neural network (NN). The training circuit is configured to perform sampling the input signal conditions, and selecting a DPD model from a set of polynomial models for the DPD controller and a set of DDA optimization variables for the DDA controller, using optimized DPD model and DDA coefficients. In this case, the optimized DPD model and DDA coefficients are provided by performing an offline optimization for the DPD model and DDA coefficients based on a predetermined optimization method, collecting the optimized DPD coefficients and optimized DDA optimization variables, generating online-DDA optimal coefficients and DPD optimal coefficients using a trained DDA-DPD NN, and updating the generated optimal DDA and DPD coefficients via the output terminals of the interface.

The multi-input PA module 120 includes a carrier power amplifier (PA) 121 for controlling carrier signals and a peak power amplifier (PA) 122 for controlling peak signals, and a second peak power amplifier (PA) 122n for controlling second peak signals, and an output combiner 123 for combining the signals from the PAs 121, 122 and 122n. In this case, the signal convertor 110 includes three or more than three DACs and three or more than three Up-convertors, and the multi-input PA module 120 includes three or more than three power amplifiers 121, 122 and 122n.

The DDA adaptive control module 351 generates updated DPA parameters 313 using the input signals 301 and output signals 300 of the multi-input PA module 120, and provides the updated DPA parameters 313 to the Amp-phase module 103. Then the Amp-phase module 103 provides signals to the signal convertor 110 such that the signal convert generates S1, S2 and S2n to be applied to the PA 121, the PA 122 and PA 122n, respectively.

As described above, the optimal control parameters 313 are computed using the adaptive control module 351. Detailed discussion regarding the optimal control parameters will be provided below.

Figure 4A:
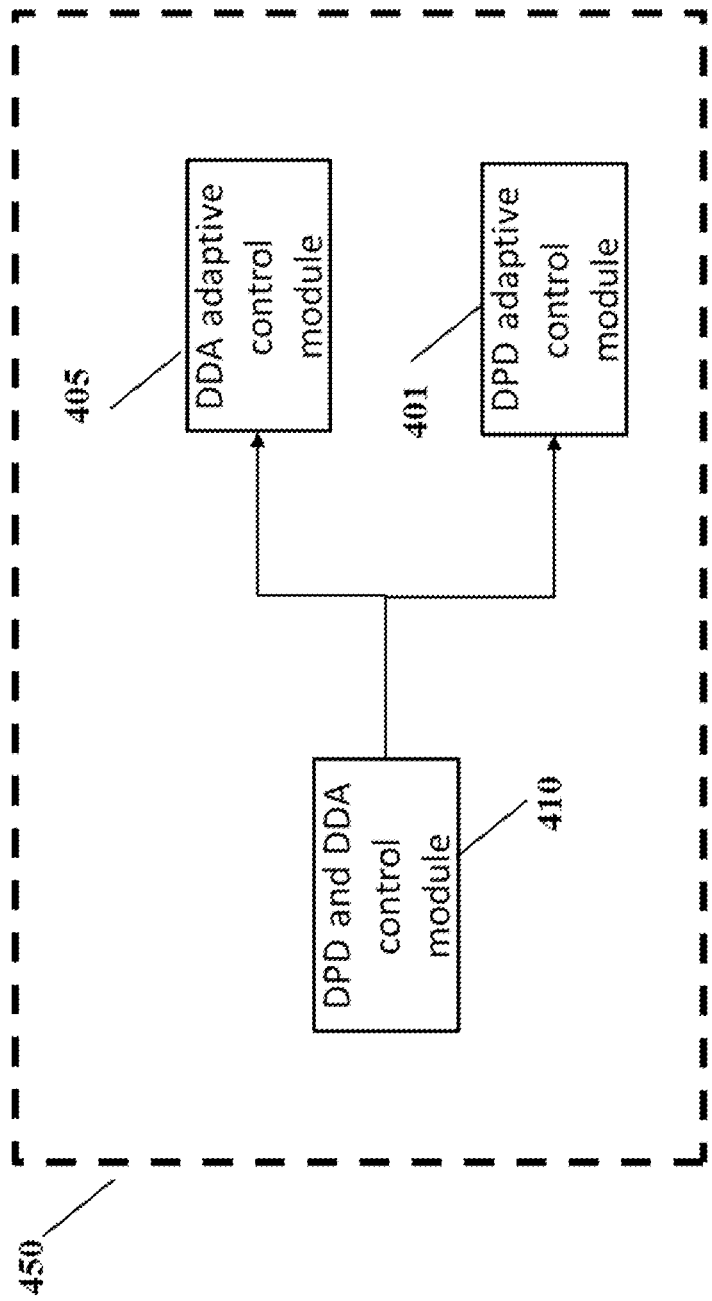
FIG. 4A is a schematic illustrating a block diagram showing a shared control module for DPD and DDA, according to embodiments of the present invention.
Figure 4B:
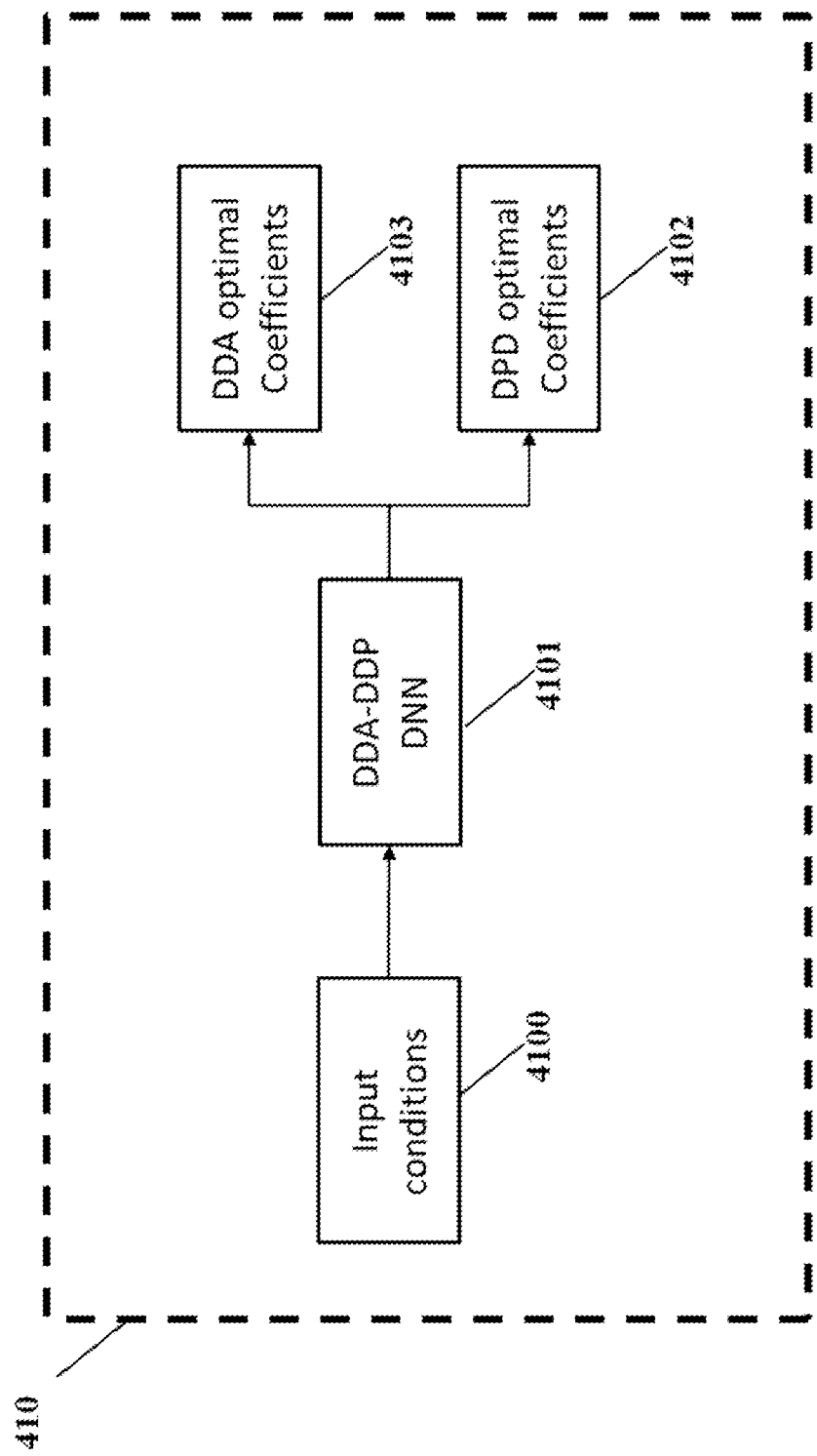
FIG. 4B is a schematic illustrating a block diagram showing a realization of the shared control module for DPD and DDA using a deep neural network, according to embodiments of the present invention.
Figures 1, 4B:
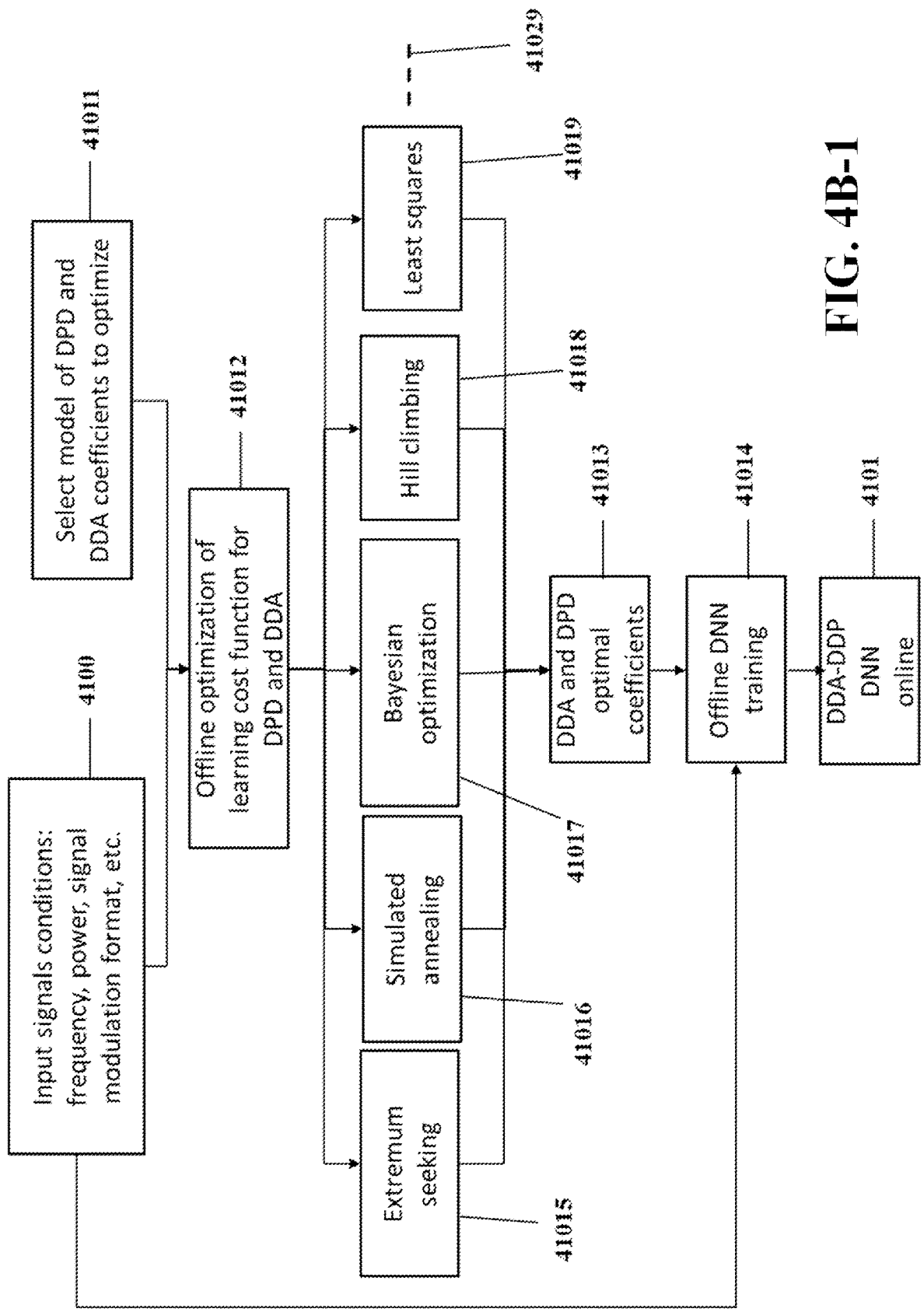
Figures 2, 4B:
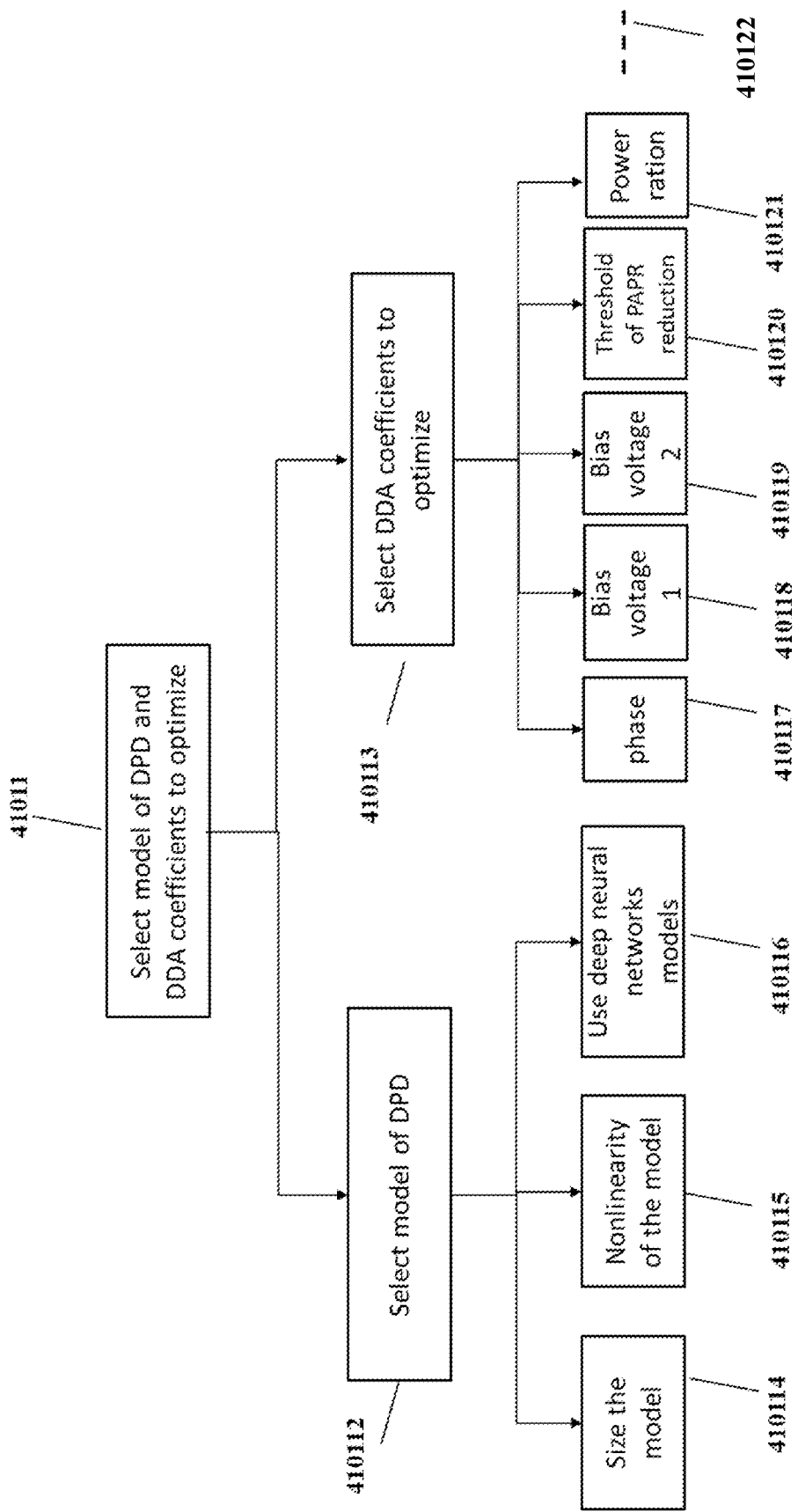

In FIG. 4A, one embodiment of this invention 450 is the design of a shared control module for DPD and DDA 410, which sent optimal coefficients to the DDA control module 405, and to the DPD control module 401. In some embodiments of this invention we propose that the shared control module 410 be implemented as follows: In FIG. 4B, for a given input signal condition 4100, the DDA-DPD deep neural network (DNN) 4101 generates online DDA optimal coefficients 4103, which will be sent to the DDA, as well as, DPD optimal coefficients 4102 which will be sent to the DPD model.

As in FIG. 4B-1, the DDA-DPD DNN 4101 needs to be trained offline 41014. The training process follows the following steps: First, the input signals conditions 4100, as in FIG. 4D, are sampled from different frequencies 41001, power signals 41002, and signal modulation formats 41003, etc. 41004, then a model of DPD is selected and a set of optimization variables for the DDA are selected 41011. As in FIG. 4B-2, the DPD model 410112 can be selected as and the DDA coefficients are chosen from a set of polynomial models with different sizes 410114, in one embodiment; in another embodiment a nonlinear trigonometric model or other nonlinearity is selected 410115, yet in another embodiment a deep neural network model if selected as a DPD model 410116. The set of optimization variables for the DDA are selected 41011 among the following coefficients: The threshold of PAPR redu 410120, the power ratio 410121, the phase difference 410117, the attenuation difference, the main bias voltage of the power amplifier 410118, the peak bias voltage of the power amplifier 410119, etc. This optimization of the DPD and DDA can be done using extremum seeking optimization 41015, simulated annealing 41016, Bayesian optimization 41017, hill climbing 41018, least squares 41019, etc. 41029. Once this optimization has been conducted, we collect the DDA and DPD optimal coefficients 41013, then these coefficients are used together with the input signal conditions 4100, to train offline the DDA-DPD DNN 41014. In this training phase, the inputs of the DDA-DPD DNN 41014 are the input signal conditions 4100, and the outputs of the DDA-DPD DNN 41014 are the optimal DDA and DPD coefficients 41013. The training of this DDN can be done by any DDN training method. For example, in some embodiments we can use Adam method, or gradient descent, or stochastic gradient descent, etc. When the training of the DDN 41014 has converged, we obtain the DDA-DDP DNN to be used online to generate optimal DDA and DPD coefficients for any new input signal conditions 4100.

Figure 4C:
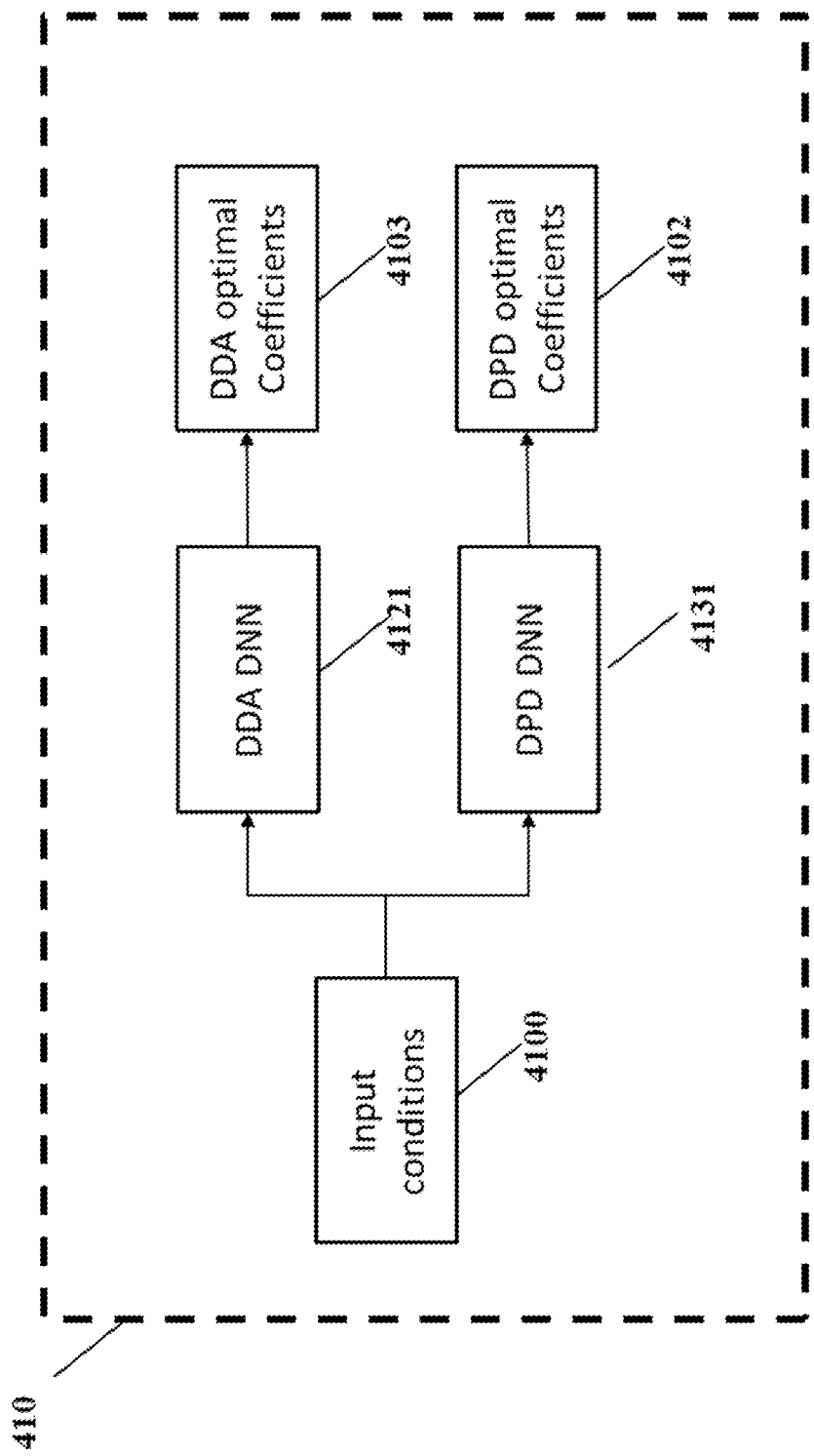
FIG. 4C is a block diagram showing a realization of the shared control module for DPD and DDA using deep neural networks, according to embodiments of the present invention.
Figures 1, 4C:
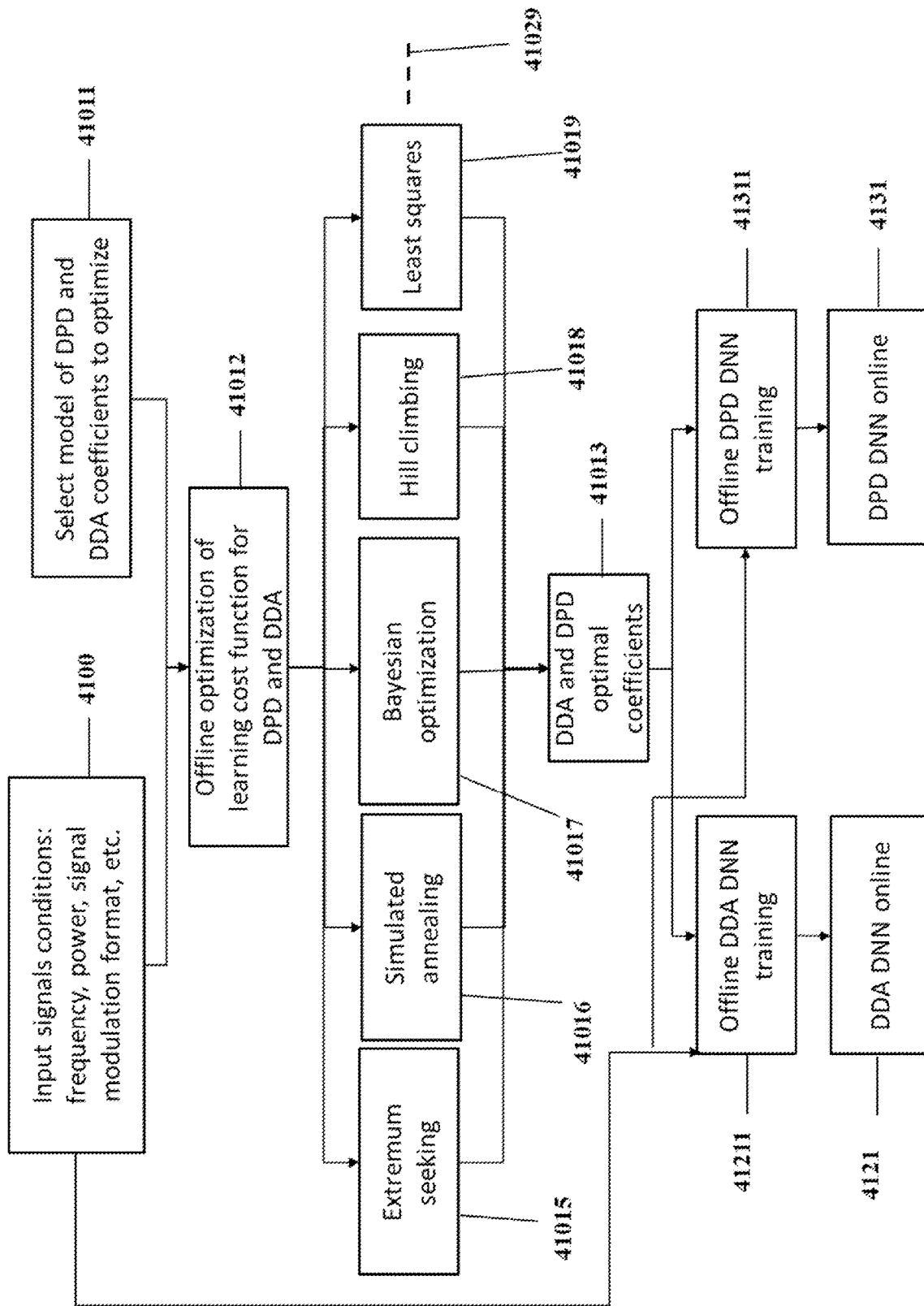
Figure 4D:
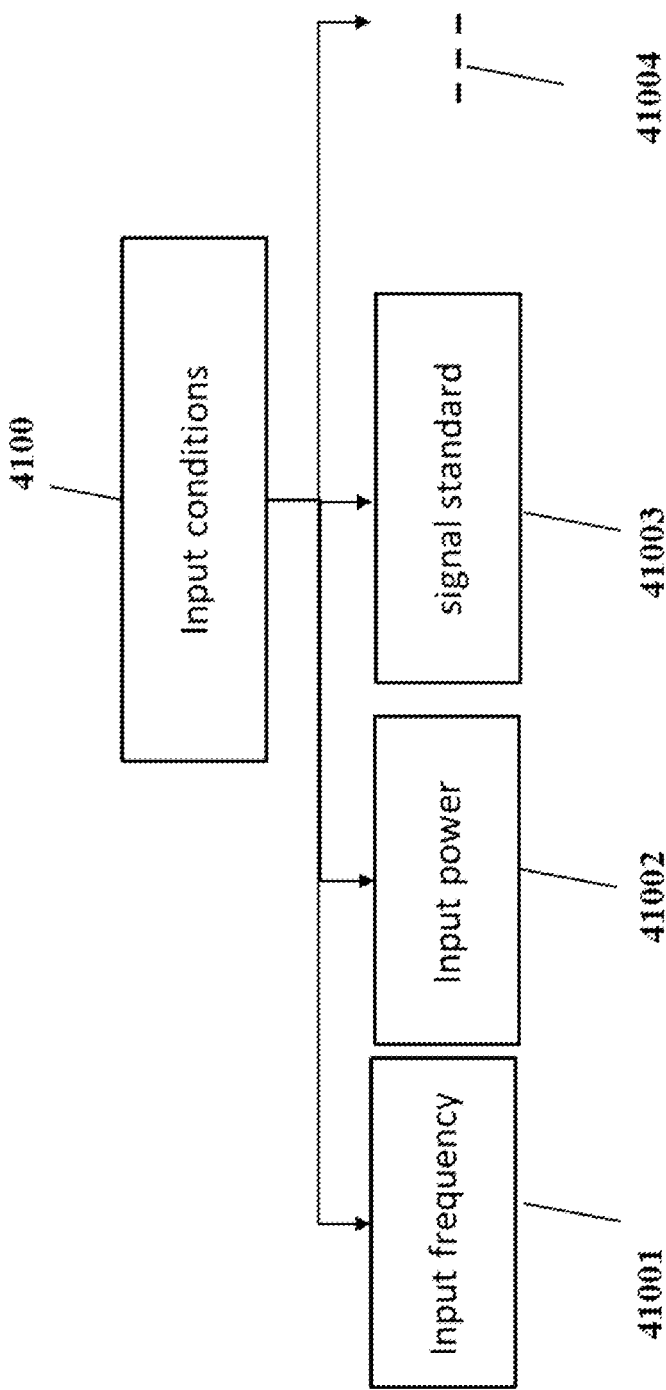
FIG. 4D is a block diagram showing the realization of input signal conditions, according to embodiments of the present invention.

In FIG. 4C, as another embodiment, the shared control module 410 can be implemented as follows. For a given input signal condition 4100, two DDNs are obtained, one DDA DNN 4121, and one DPD DNN 4131. The DDA DNN 4121, generates online DDA optimal coefficients 4103, which will be sent to the DDA. The DPD DNN 4131, generates online DPD optimal coefficients 4102, which will be sent to the DPD.

As in FIG. 4C-1, the two separate DDA DNN 4102, and DPD DNN 4103 need to be trained offline 41211, 41311. The training process follows the following steps:

First, the input signals conditions are sampled from different frequencies, power signals, and signal modulation formats, etc. 410111, then a model of DPD is selected and a set of optimization variables for the DDA are selected 41011. The DPD model 410122 (410112) can be selected from a set of polynomial models with different sizes 410114, in one embodiment; in another embodiment a nonlinear trigonometric model or other nonlinearity is selected 410115, yet in another embodiment a deep neural network model if selected as a DPD model 410116. The set of optimization variables for the DDA are selected 410113 among the following coefficients: The threshold of PAPR redu 410120, the power ratio 410121, the phase difference 410117, the attenuation difference, the main bias voltage of the power amplifier 410118, the peak bias voltage of the power amplifier 410119, etc. Then, an offline optimization of the DDA and DPD is conducted 41012, This optimization of the DPD and DDA can be done using extremum seeking optimization 41015, simulated annealing 41016, Bayesian optimization 41017, hill climbing 41018, least squares 41019, etc. 41029. Once this optimization has been conducted, we collect the DDA and DPD optimal coefficients 41013, then these coefficients are used together with the input signal conditions 4100, to train offline the DDA DNN 41211, and the DPD DNN 41311. For the training of the DDA DNN, the DNN inputs are the input signal conditions 4100, and the outputs of the DDA DNN 41211 are the optimal DDA coefficients 4103. For the training of the DPD DNN, the DNN inputs are the input signal conditions 410111, and the outputs of the DPD DNN 41311 are the optimal DPD coefficients 4102. The training of these DDNs can be done by any DDN training method. For example, in some embodiments we can use Adam method, or gradient descent, or stochastic gradient descent, robust DNNs training, etc. When the training of the DDA DDN 41211 has converged, we obtain the DDA DNN to be used online to generate optimal DDA coefficients for any new input signal conditions 410111. When the training of the DPD DDN 41311 has converged, we obtain the DPD DNN to be used online to generate optimal DPD coefficients for any new input signal conditions 4100.

Figure 4E:
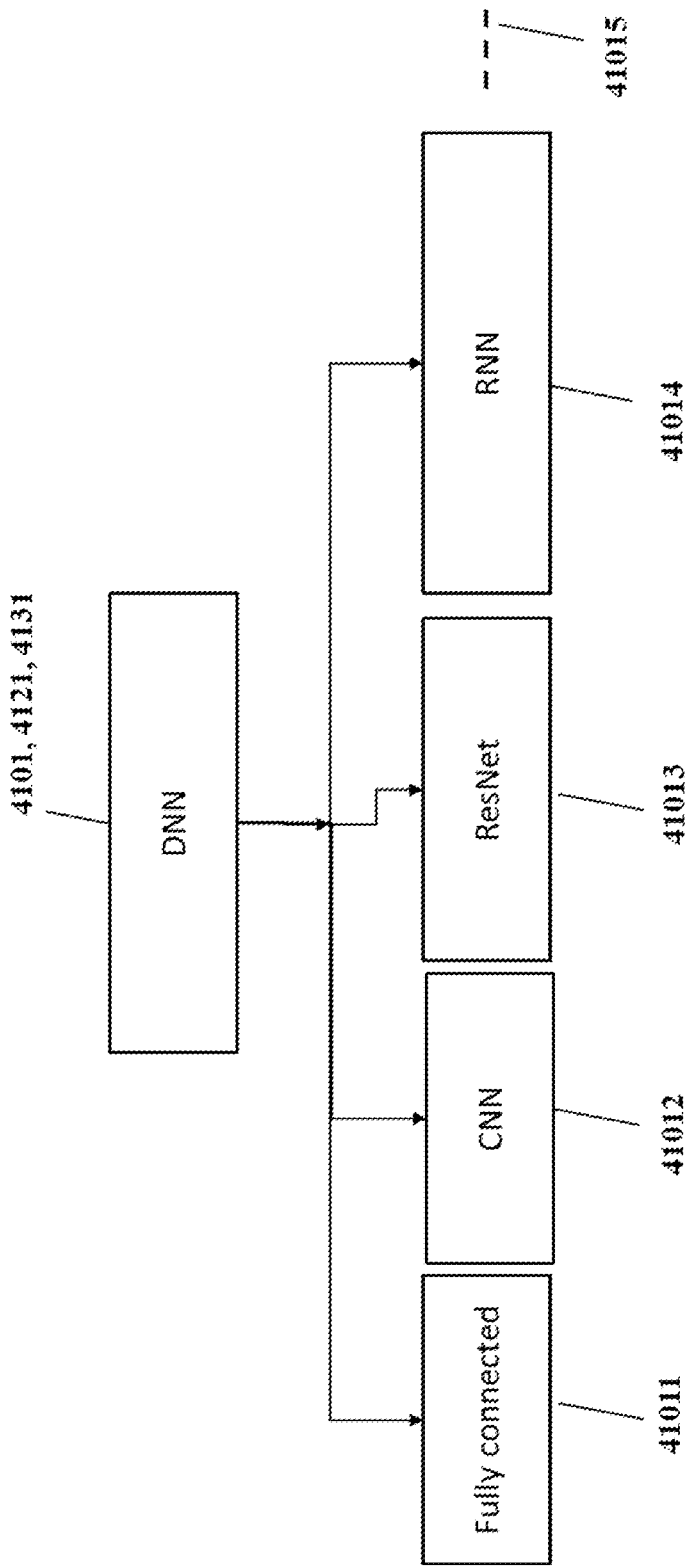
FIG. 4E is a block diagram showing several choices of DNNs for the DDA DNN control module and DPD DNN control module, according to embodiments of the present invention.
Figure 4F:
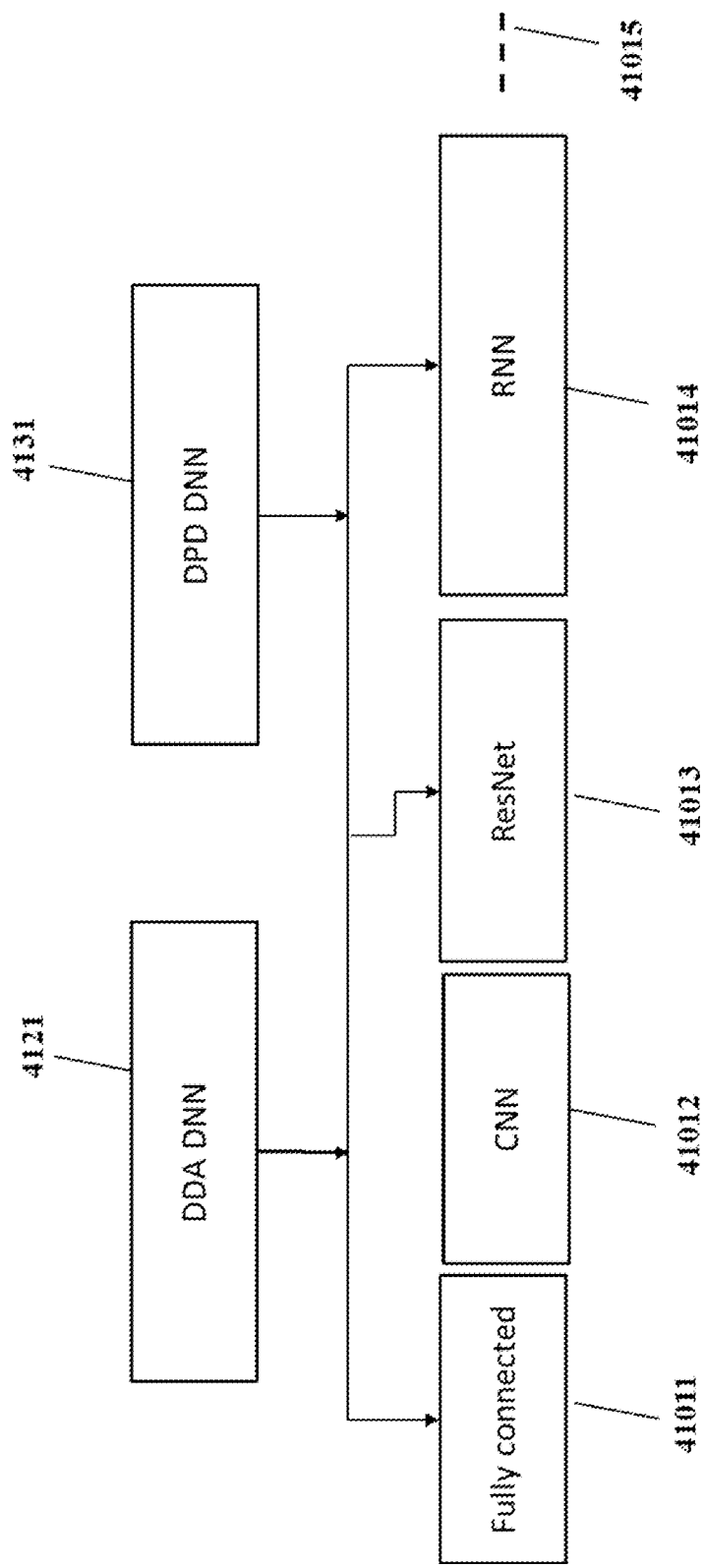
FIG. 4F is a block diagram illustrating other choices of DNNs for the DDA DNN control module and DPD DNN control module, according to embodiments of the present invention.

As in FIGS. 4E-4F, in different embodiments of this invention, we can use different type of DNNs 4101, 4121, 4131. For example, fully connected DNN 41011, convolutional neural networks 41012, Residual networks 41013, recurrent neural networks 41014, etc. 41015.

Figure 5:
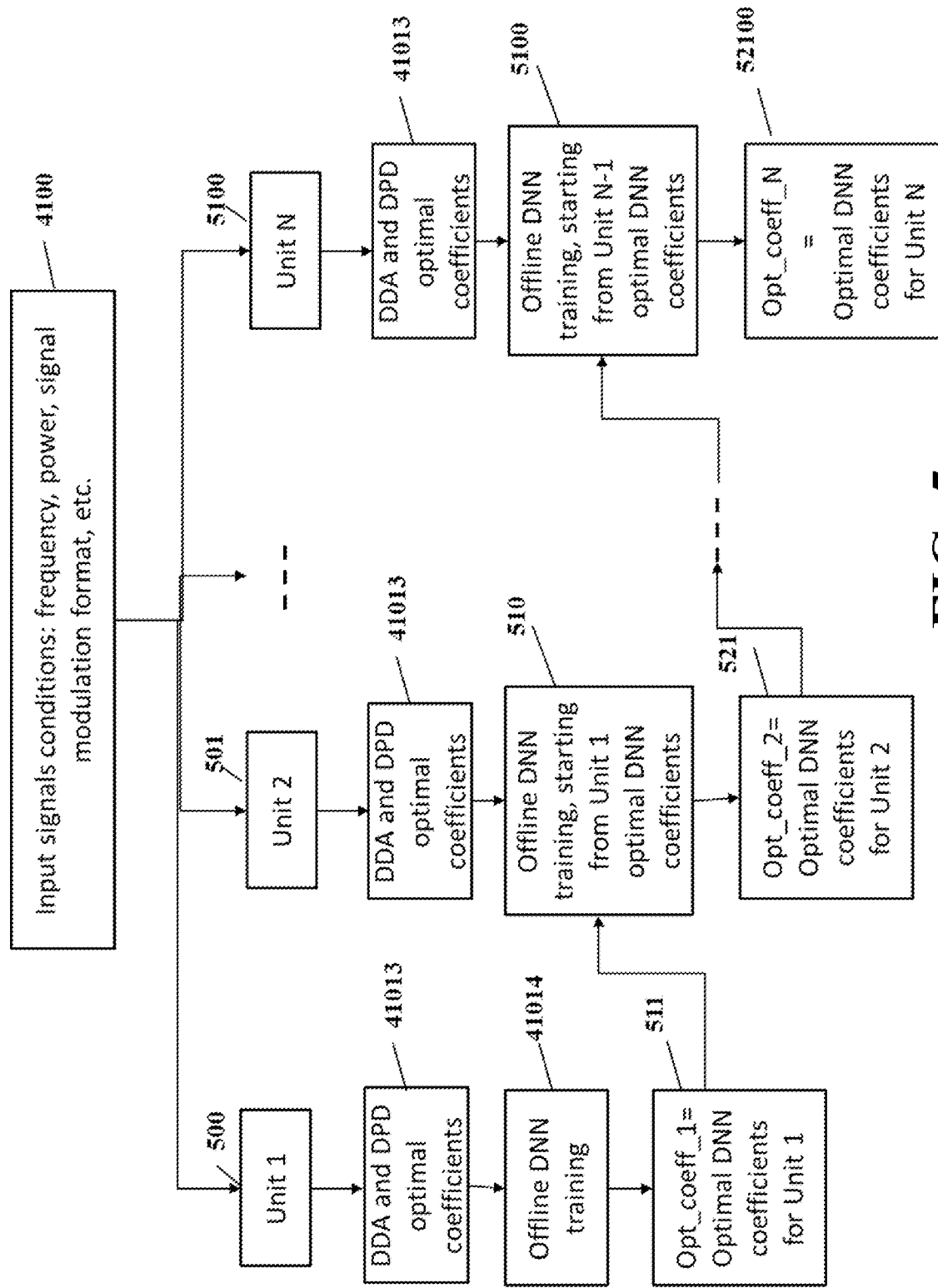
FIG. 5 is a block diagram showing a transfer learning process of for DPD and DDA control modules, according to embodiments of the present invention.

FIG. 5 is a block diagram showing a transfer learning process of for DPD and DDA control modules, according to embodiments of the present invention. In some embodiments of the current invention, a transfer learning procedure is performed from one unit 500, to another Unit 501, 5100. For example in one embodiment of such implementation of transfer learning, we propose to start from a given Unit 1 500 and then for given input conditions 4100, we compute off-line 41013 the corresponding DDA and DPD optimal coefficients, which are then used to training off-line the corresponding DNN 41014 associated with Unit 1 500. Then for the next Unit 2 501, for given input conditions 4100, similar or different from input conditions of Unit 1, we compute off-line the DDA and DPD optimal coefficients 41013, which are then used for off-line training of DNN 521 corresponding to Unit 2. The trick for transfer learning is to use the optimal coefficeint Opt_coeff_1 for the DNN for Unit 1 to warm start the training of the DNN for Unit 2 510. Next for another Unit N 5100, we proceed with similar training, where we strat the training of the new DNN, using the optimal coefficients of the DNN for Unit N−1 5100.

This transfer learning between units can also be embodied by fixing part of the DNN coefficients to their optimal values obtained for a previous Unit, and re-training the new DNN associated with the new Unit, by training only part of the coefficients of the DNN.

Yet another transfer learning embodiment can be done by extending the DNN with extra layers, for each new Unit and re-training the DNN while learning only the coefficients of the extra layers and keeping the coefficients of the other layers equal to the optimal coefficients obtained for the previous Unit.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

The invention claimed is:

1. An auto-tuning controller for improving a performance of a power amplifier system, comprising:
    an interface including input terminals and output terminals, the interface being configured to acquire input signal conditions of power amplifiers (PAs);
    a training circuit including a processor and a memory running and storing a Digital Doherty amplifier (DDA) controller (module), a Digital Pre-Distortion (DPD) controller (module) and a DDA-DPD neural network (NN), wherein the training circuit is configured to perform:
    sampling the input signal conditions, and selecting a DPD model from a set of polynomial models for the DPD controller and a set of DDA optimization variables for the DDA controller;
    using optimized DPD model and DDA coefficients, wherein the optimized DPD model and DDA coefficients are provided by performing an offline optimization for the DPD model and DDA coefficients based on a predetermined optimization method;
    collecting optimized DPD coefficients and the optimized DDA optimization variables; generating online-DDA optimal coefficients and DPD optimal coefficients using a trained DDA-DPD NN; and updating the generated optimal DDA and DPD coefficients via the output terminals of the interface.

2. The auto-tuning controller of claim 1, wherein the offline optimization is performed based on prior optimized DPD model and DDA coefficients.

3. The auto-tuning controller of claim 1, wherein the optimization variables include threshold of peak to average power ratio reduction (PAPR), a power ratio, a phase difference, an attenuation difference, a main bias voltage of the PAs, a peak bias voltage of the PAs.

4. The auto-tuning controller of claim 1, wherein the offline optimization is performed by an Adam method, a gradient descent, or a stochastic gradient descent method.

5. The auto-tuning controller of claim 1, wherein the input signal conditions include at least frequencies, signal power levels, and signal modulation formats of PAs.

6. The auto-tuning controller of claim 1, wherein the neural network is a convolutional neural network (CNN), a deep neural network (DNN) or a robust DNN.

7. The auto-tuning controller of claim 1, wherein the trained DDA-DPD NN has been offline-trained based on both the input signal conditions and the optimized DPD and DDA coefficients.

8. The auto-tuning controller of claim 1, wherein the predetermined optimization method is an extremum seeking optimization, a simulated annealing, Bayesian optimization, a hill climbing, genetic evolution or a least squares method.

9. The auto-tuning controller of claim 1, wherein the DDA-DPD NN obtained for one DDA unit can be transferred to a different DDA unit, where the transfer is done by finite-tuning the DDA-DPD NN using sparse data from the new DDA unit.

10. The auto-tuning controller of claim 1, wherein the interface is configured to connect to at least two power transistors.

11. The DDPA system of claim 10, wherein the interface is configured to connect to at least two power transistors.

12. A Digital Doherty Power-Amplifier (DDPA) system comprising:
    an auto-tuning controller of claim 1; and
    a Doherty power amplifier (DPA) circuit having control inputs and an output for generating output signals.

13. The DDPA system of claim 12, wherein the offline optimization is performed from prior optimal points.

14. The DDPA system of claim 12, wherein the optimization variables include threshold of peak to average power ratio reduction (PAPR), a power ratio, a phase difference, an attenuation difference, a main bias voltage of the PAs, a peak bias voltage of the PAs.

15. The DDPA system of claim 12, wherein the offline optimization is performed by an Adam method, a gradient descent, or a stochastic gradient descent method.

16. The DDPA system of claim 12, wherein the input signal conditions include at least frequencies, signal power levels, and signal modulation formats of PAs.

17. The DDPA system of claim 12, wherein the neural network is a convolutional neural network (CNN), a deep neural network (DNN) or a robust DNN.

18. The DDPA system of claim 12, wherein the trained DDA-DPD NN has been offline-trained based on both the input signal conditions and the optimized DPD and DDA coefficients.

19. The DDPA system of claim 12, wherein the predetermined optimization method is an extremum seeking optimization, a simulated annealing, Bayesian optimization, a hill climbing, genetic evolution or a least squares method.

20. The DDPA system of claim 12, where the DDA-DPD NN obtained for one DDA unit can be transferred to a different DDA unit, where the transfer is done by fine-tuning the DDA-DPD NN using sparse data from the new DDA unit.

* * * * *